(12) United States Patent
Yeh et al.

(10) Patent No.: US 8,310,384 B2
(45) Date of Patent: Nov. 13, 2012

(54) PHASE DIGITIZING APPARATUS AND METHOD THEREOF

(75) Inventors: Po Lin Yeh, Hsinchu Hsien (TW);
Chien-Hsing Lin, Hsinchu Hsien (TW);
Shao Ping Hung, Hsinchu Hsien (TW);
Chih-Tien Chang, Hsinchu Hsien (TW);
Chun-Chia Chen, Hsinchu Hsien (TW);
Jui-Hua Yeh, Hsinchu Hsien (TW)

(73) Assignee: MStar Semiconductor, Inc., Hsinchu Hsien (TW)

( * ) Notice: Subject to any disclaimer, the term of this patent is extended or adjusted under 35 U.S.C. 154(b) by 73 days.

(21) Appl. No.: 12/956,071

(22) Filed: Nov. 30, 2010

(65) Prior Publication Data

US 2011/0187567 A1    Aug. 4, 2011

Related U.S. Application Data

(60) Provisional application No. 61/300,831, filed on Feb. 3, 2010.

(51) Int. Cl.
*H03M 1/48*    (2006.01)

(52) U.S. Cl. .......................... 341/111; 341/155; 341/110
(58) Field of Classification Search .................. 341/111, 341/110, 144, 155, 120; 375/376; 327/158
See application file for complete search history.

(56) References Cited

U.S. PATENT DOCUMENTS

| | | | | |
|---|---|---|---|---|
| 6,125,158 | A  * | 9/2000 | Carson et al. | 375/376 |
| 6,912,012 | B2 * | 6/2005 | Renner et al. | 348/536 |
| 7,339,408 | B2 * | 3/2008 | Lee | 327/158 |
| 7,734,002 | B2 * | 6/2010 | Yi | 375/376 |

* cited by examiner

*Primary Examiner* — Peguy Jean Pierre
(74) *Attorney, Agent, or Firm* — Edell, Shapiro & Finnan, LLC

(57) ABSTRACT

A phase digitizing apparatus for generating a corresponding digital value in response to a phase of an input signal is provided. The phase digitizing apparatus includes a coarse phase code generator, for generating a coarse phase code according to the phase of the input signal and a first time unit; a fine phase code generator, for generating a fine phase code according to the phase of the input signal and a second time unit; and a calculating unit, for generating the digital value according to the coarse phase code and the fine phase code; wherein the first time unit is greater than the second time unit.

18 Claims, 10 Drawing Sheets

PHASE DIGITIZING APPARATUS AND METHOD THEREOF

CROSS REFERENCE TO RELATED PATENT APPLICATION

This patent application claims the benefit of U.S. Provisional Patent Application No. 61/300,831, filed on Feb. 3, 2010, the entirety of which is incorporated herein by reference.

FIELD OF THE INVENTION

The present invention relates to a phase digitizing apparatus and method thereof, and more particularly to a phase digitizing apparatus and method thereof for digitizing a phase of an input signal.

BACKGROUND OF THE INVENTION

A frequency synthesizer is an electronic system for generating a desired time domain signal, which can be found in many modern devices, including radio receivers, mobile telephones, radiotelephones, walkie-talkies, CB radios, satellite receivers, GPS systems, etc. The frequency synthesizer can combine frequency multiplication, frequency division, and frequency mixing (the frequency mixing process generates sum and difference frequencies) operations to produce the desired time domain signal.

Synthesizers used in commercial radio receivers are largely based on phase-locked loops (PLLs). Many types of frequency synthesizers are available as integrated circuits, reducing cost and size. High end receivers and electronic test equipment use more sophisticated techniques, often in combination.

The frequency synthesizer comprises a phase error digitizer to calculate a phase error. FIG. 1 is a block diagram of a conventional phase error digitizer 10. The conventional phase error digitizer 10 comprises a phase comparator 120 and a type converter 140.

The phase comparator 120 compares phases of two input signals, Hsync and FBsync, and outputs a comparison output CMPOut with only one bit. The difference in phase between the two input signals is called phase error. When the phase error is zero or very small, the phases of the two input signals are equal. The type converter 140 converts the comparison output CMPOut with 1 bit to a phase error with 7 bits.

The conventional phase error digitizer is difficult to design and implement, more expensive, larger and more sensitive to voltage noise, temperature and process than an all-digital phase error digitizer. Therefore, an all-digital phase error digitizer is urgently needed.

SUMMARY OF THE INVENTION

It is one of the objectives of the present invention to provide a phase digitizing apparatus and method thereof designed by all digital circuits.

The invention provides a phase digitizing apparatus for generating a corresponding digital value in response to a phase of an input signal, and comprises: a coarse phase generator, for generating a coarse phase code according to the phase of the input signal and a first time unit; a fine phase generator, for generating a fine phase code according to the phase of the input signal and a second time unit; and a calculating unit, for generating the digital value according to the coarse phase code and the fine phase code; wherein the first time unit is greater than the second time unit.

The invention further provides a phase digitizing method for generating a corresponding digital value in response to a phase of an input signal, wherein the method comprises: generating a coarse phase code according to the phase of the input signal and a first time unit; generating a fine phase code according to the phase of the input signal and a second time unit; and generating the digital value according to the coarse phase code and the fine phase code; wherein the first time unit is greater than the second time unit.

The invention provides a phase digitizing apparatus and method thereof including all digital circuits to address the disadvantages of a conventional phase error digitizing apparatus noted above.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF THE PREFERRED EMBODIMENT

Figure 1:
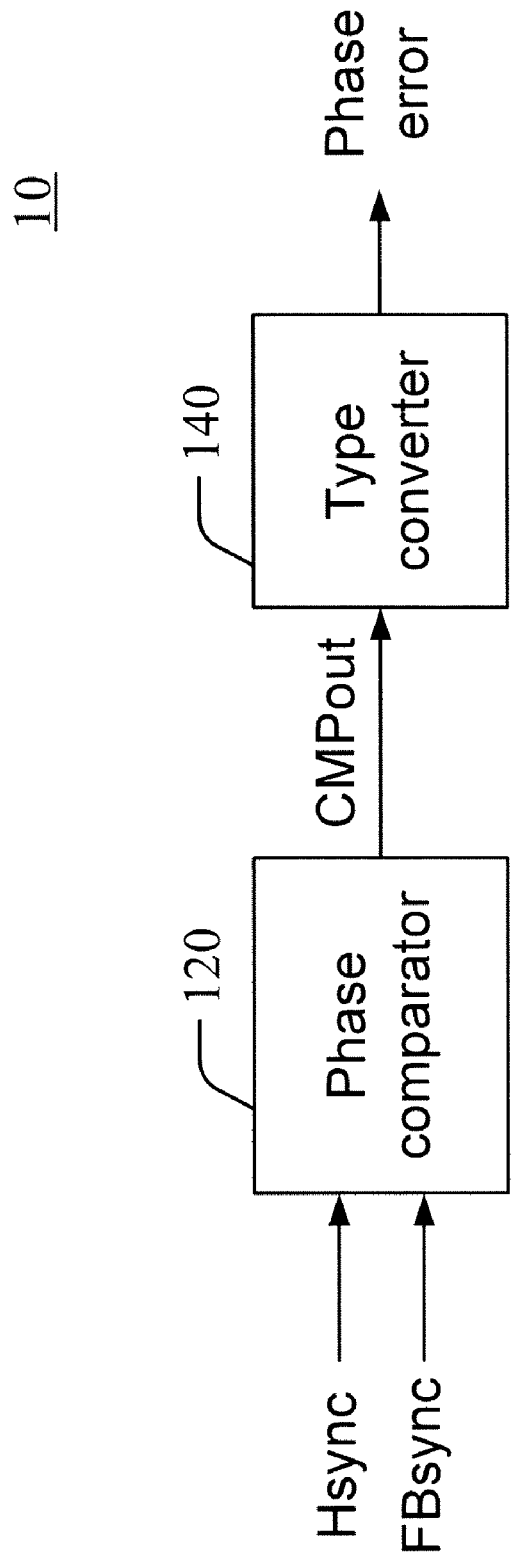
FIG. 1 is a block diagram of a conventional phase error digitizer.
Figure 2:
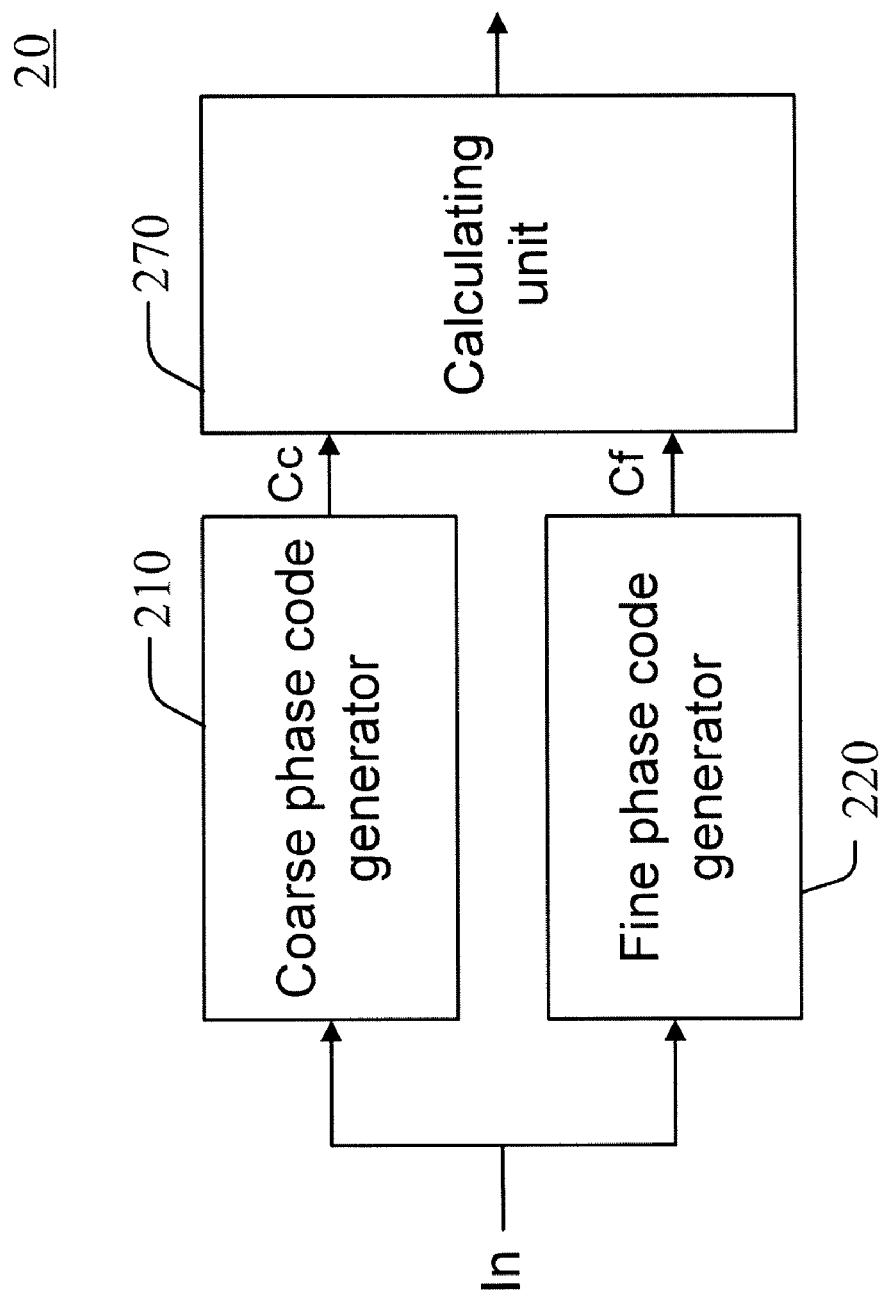
FIG. 2 is a block diagram of a phase digitizing apparatus according to a first embodiment of the present invention.

FIG. 2 is a block diagram of a phase digitizing apparatus according to a first embodiment of the present invention. The phase digitizing apparatus 20 comprises a coarse phase code generator 210, a fine phase code generator 220 and a calculating unit 270. The coarse phase code generator 210 generates a coarse phase code Cc according to a phase of an input signal In. The coarse phase code is a binary code that can be represented by binary 0 and 1. The fine phase code generator 220 generates a fine phase code Cf according to the phase of the input signal In. The coarse phase code generator 210 and the fine phase code generator 220 generate the coarse phase code Cc and the fine phase code Cf according to different time units respectively. The calculating unit 270 generates a phase digital value representing the phase of the input signal In according to the coarse phase code Cc and the fine phase code Cf.

Figure 3:
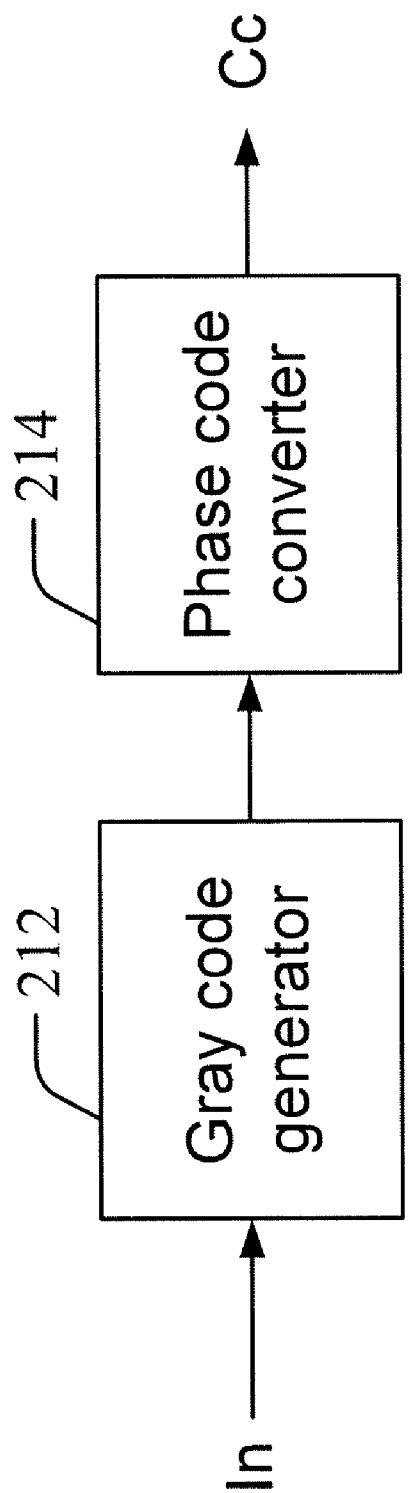
FIG. 3 is a block diagram of an embodiment of a coarse phase code generator.

In the embodiment, the phase is digitized to the coarse phase code Cc and the fine phase code Cf such that the phase is presented in a plurality of orders rather than in one single order. The final phase code is decided in multiple orders. For example, assume that the original phase code is 249, and the coarse time unit Tc of the coarse phase code Cc comprises 8 fine time units of the fine phase code Cf, the original phase code 249 can be represented by 31 coarse time units Tc plus 1 fine phase code Tf, i.e., the coarse phase code Cc=31 and the fine phase code Cf=1. In a hardware implementation, fewer clock signals are needed with different phases when presenting the phase code with multiple orders. Hence, it saves more dimensions and costs to use multiple orders of phase code. FIG. 3 is a block diagram of an embodiment of the coarse phase code generator 210. The coarse phase code generator 210 comprises a Gray code generator 212 and a phase code converter 214. In this embodiment, the input signal In passes the Gray code generator 212 to generate a Gray code corresponding to the phase of the input signal In. The Gray code is converted to the coarse phase code Cc by the phase code converter 214. Since only one of the bits is different between two adjacent Gray codes, the Gray code substitutes the binary code to reduce interference of synchronization errors of the clock signal with pulse-code modulation (PCM).

Figure 4:
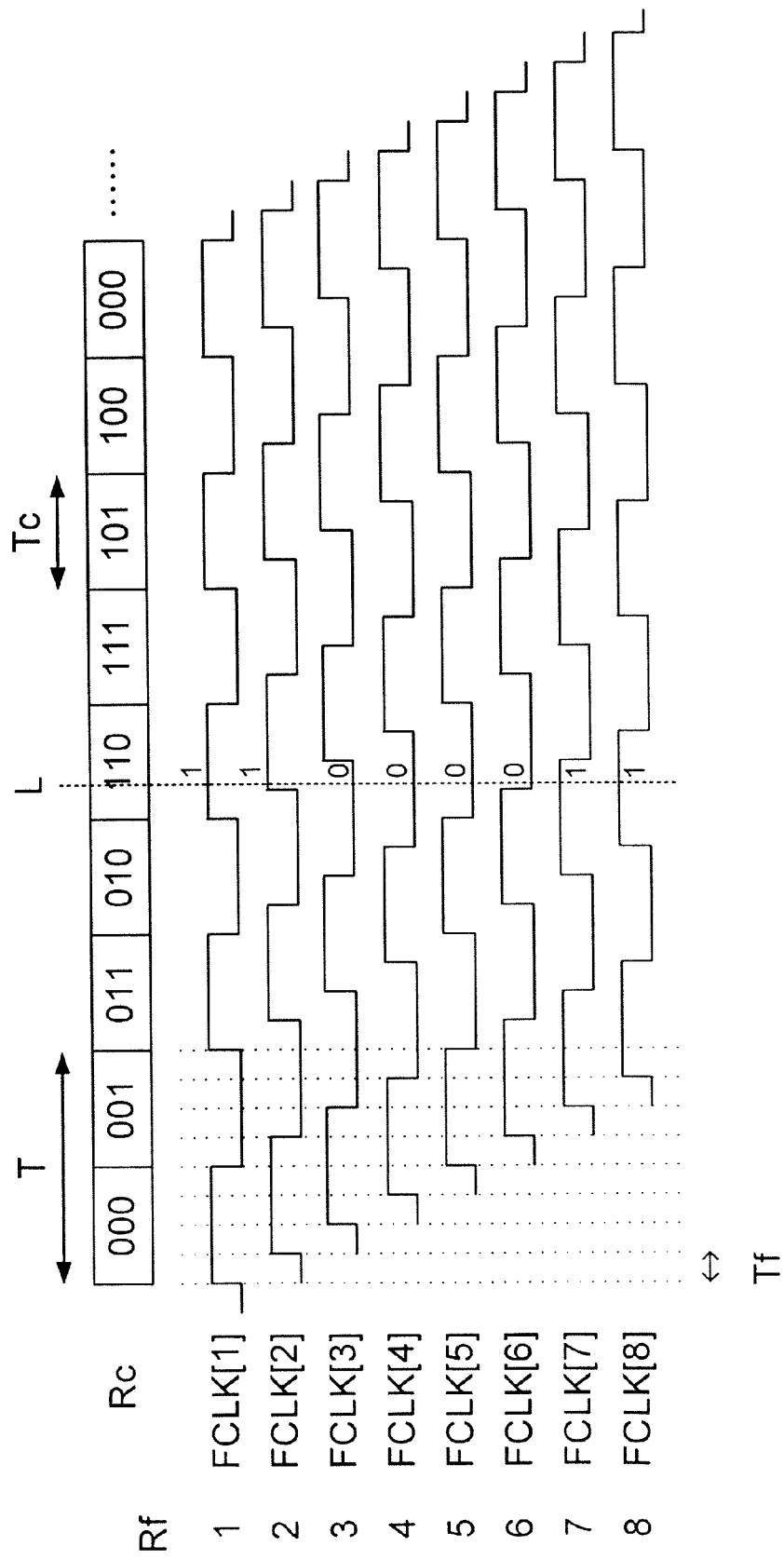
FIG. 4 illustrates a diagram for generating a coarse phase code and a fine phase code according to one embodiment of the present invention.

FIG. 4 illustrates a diagram for generating the coarse phase code and the fine phase code according to one embodiment of the present invention. In the embodiment, the coarse time unit and the fine time unit are generated according to the clock signal of a voltage-controlled oscillator (VCO). One clock period of the VCO is denoted as 1T. In the embodiment, one clock period of the VCO corresponds to 2 coarse time units Tc, and one coarse time unit Tc corresponds to 4 fine phase time units Tf, i.e., one clock period of the VCO corresponds to 8 fine time units Tf. Those skilled in the art will appreciate that the number of the coarse time units Tc corresponding to each clock period of the VCO and the number of the fine time units Tf corresponding to the coarse time units Tc can be adjusted, and the specific relationships described herein should not be construed to limit the scope of the invention.

For each coarse time unit Tc within a predetermined time, a coarse ruler Rc is generated according to the Gray code, and the coarse ruler Rc may be cyclic. In this embodiment, the predetermined time is 4T, so the Gray code can be the same at every 4T distance. In FIG. 4, the coarse ruler Rc starts from 000, then 001, 011, 010, 110, 111, 101 and 100 takes place in turn, where the corresponding binary codes are 000 (0), 001 (1), 010 (2), 011 (3), 100 (4), 101 (5), 110 (6) and 111 (7), respectively. After 4T length of time, the coarse ruler Rc is cyclically back to 000. Not only one kind of the Gray code coding can be utilized, and one can customize the Gray code according to user's preference or requirement. Those skilled in the art will appreciate that the coarse ruler Rc can also be generated directly by a binary code. That is, the specific coding method of the coarse ruler should not be construed to limit the scope of the invention.

The clock signal of the VCO is delayed one fine time unit Tf sequentially to generate a plurality of clock signals with different phases. By the phase differences among the clock signals, one time length is divided into multiple fine time units Tf, and the fine time units are encoded sequentially to generate a fine ruler Rf shown in FIG. 4. In the embodiment in FIG. 4, within one period of the VCO clock, the clock signal of the VCO is delayed T/8 time units sequentially to generate 8 clock signals FCLK[1]~[8], where the two adjacent clock signals have one fine time unit Tf shift, and the corresponding fine ruler Rf is numbered from 1 to 8.

In the embodiment in FIG. 4, the coarse phase code generator 210 and the fine phase code generator 220 decide the corresponding coarse phase code Cc and fine phase code Cf by detecting a positive edge triggered time point of the input signal In. When the coarse phase code generator 210 detects the positive edge of the input signal In, the coarse phase code Cc is generated according to the coarse ruler Rc. Similarly, when the fine phase code generator 220 detects the positive edge of the input signal In, the fine phase code Cf is generated according to the clock signals FCLK[1]~[8]. For example, according to the positive edge of the input signal In, based on the levels of the clock signals FCLK[1]~[8], the corresponding value of each clock signal is decided sequentially. If the clock signal is at the high level, the corresponding value is 1; otherwise, if the clock signal is at the low level, the corresponding value is 0. Accordingly, the fine phase code Cf of the positive edge of the input signal In is decided by each of the corresponding values of FCLK[1]~[8]. Those skilled in the art will appreciate that the phase of the input signal In can also be detected by negative edge triggered detection.

In FIG. 4, a line L represents the positive edge triggered time point of the input signal In. In this example, at that time, the Gray code generated by the Gray code generator 212 according to the coarse ruler Rc and the phase of the input signal In is '110', which is 4 in decimal. Accordingly, the phase code converter 214 converts the Gary code 110 to binary code 110, that is, the coarse phase code Cc outputted from the coarse phase code generator 210 is '100'. It is noted that the coarse phase code can be represented with other kinds of carry systems, and representation of the coarse phase code, as discussed, should not limit the scope of the invention.

Similarly, when the fine phase code generator 220 detects the positive edge of the input signal In, based on the levels of the clock signals FCLK[1]~[8], the corresponding value is generated sequentially as [1 1 0 0 0 0 1 1]. Then, the boundary that 1 changes to 0 (zero) is determined at a point of 2 of the fine ruler Rf. That is to say, the fine phase code generator 220 outputs 2 as the fine phase code Cf which can also be represented as the binary code 010.

Figure 5:
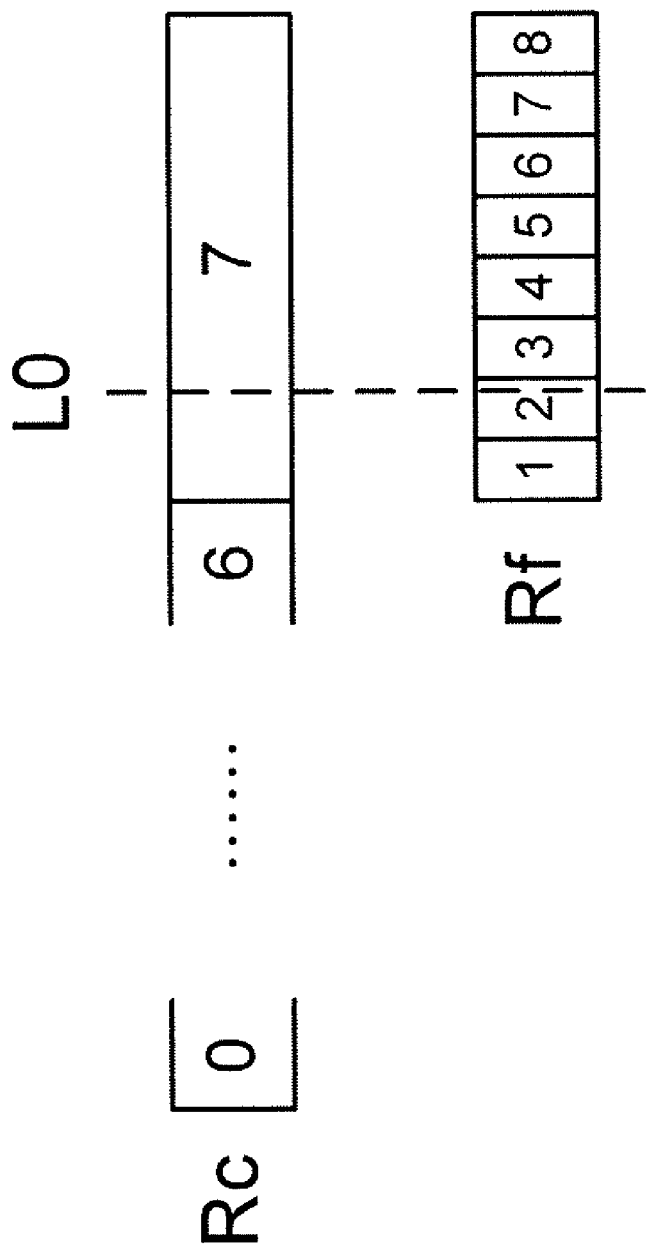
FIG. 5 illustrates a diagram for digitizing the phase according to one embodiment of the present invention.

FIG. 5 illustrates a diagram for digitizing the phase according to one embodiment of the present invention. In the embodiment, one coarse time unit Tc comprises 8 fine time units Tf. The calculating unit 270 converts the representation of the phase of the input signal In from a combination of the coarse phase code Cc and the fine phase code Cf to the fine phase code Cf only. Taking line L0 in FIG. 5 for example, where Cc=7 and Cf=2, the calculation is as follows:

$$7Tc*8Tf/Tc+2Tf=58Tf \text{ (fine time units)}$$

Figure 6:
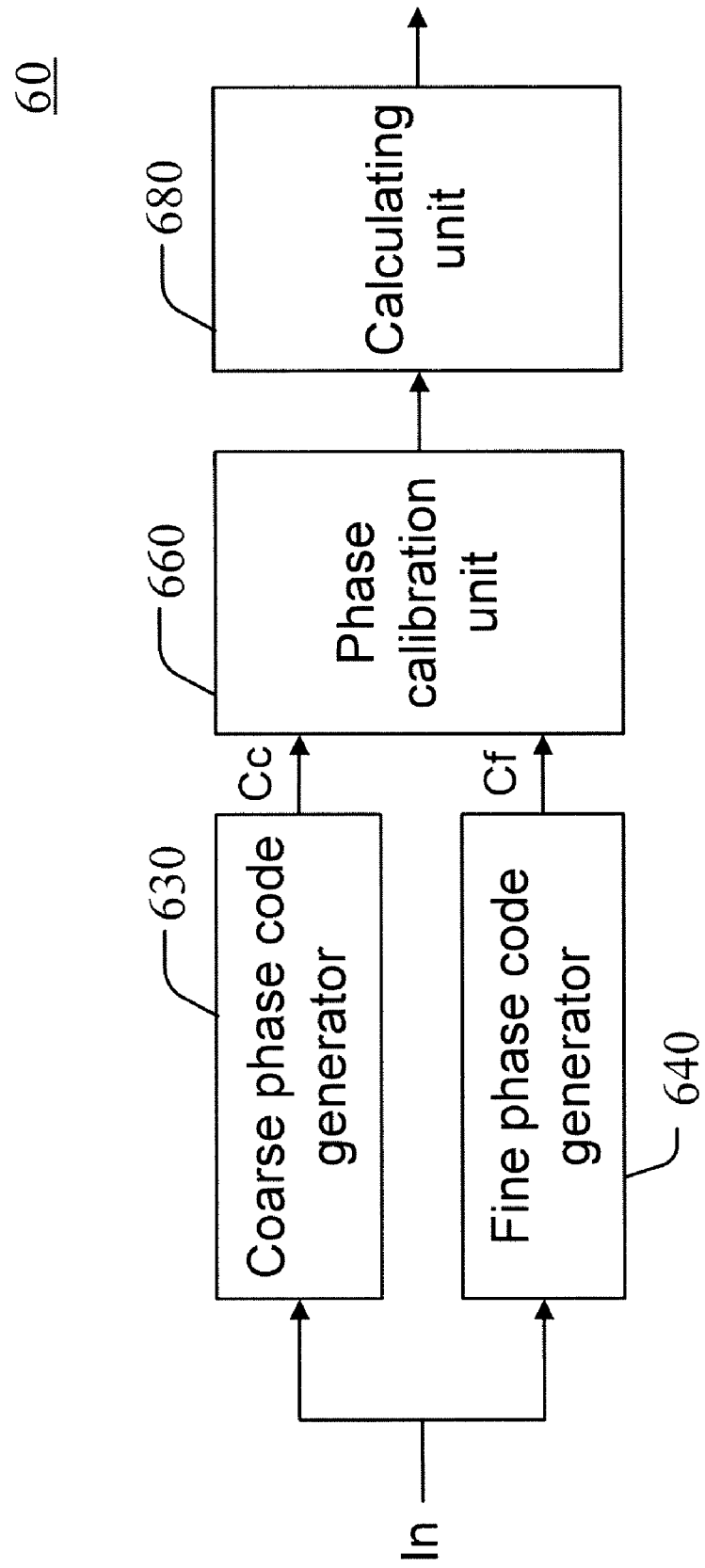
FIG. 6 is a block diagram of the phase digitizing apparatus according to another embodiment of the invention.

FIG. 6 is a block diagram of the phase digitizing apparatus according to another embodiment of the invention. The phase digitizing apparatus 60 comprises a coarse phase code generator 630, a fine phase code generator 640, a phase calibration unit 660 and a calculating unit 680. The coarse phase code generator 630, the fine phase code generator 640 and the calculating unit 680 are similar to the above coarse phase code generator 210, the fine phase code generator 220 and the calculating unit 270 respectively, and shall not be again described for brevity.

Since the fine time unit Tf has a smaller time unit, the generating method can be realized by the embodiment illustrated in FIG. 4 and the clock signal for generating fine time unit Tf can be the same as the clock signal for generating coarse time unit Tc. Otherwise, the coarse time unit Tc and the fine time unit Tf can be generated according to different clock signals respectively. Consequently, due to errors caused by different clock signals or signal delay from circuits, misalignment exists between the starting point of the coarse time unit Tc and the starting point of the fine time unit Tf, that is, a phase error exists. When calculating the phase digital value, the calculating unit 680 miscalculates the phase digital value because of the phase errors of the coarse time unit Tc and the fine time unit Tf.

Therefore, before the calculating unit 680 calculates the phase digital value, the phase calibration unit 660 calibrates the coarse phase code Cc and the fine phase code Cf by calibrating the phase error of the coarse phase code Cc and the fine phase code Cf caused by the difference of the starting point of the coarse time unit Tc and the starting point of the fine time unit Tf. Thus, the calibrating unit 680 can acquire more accurate phase digital value. The detail operation of the phase calibration unit 660 is described below.

Figure 7:
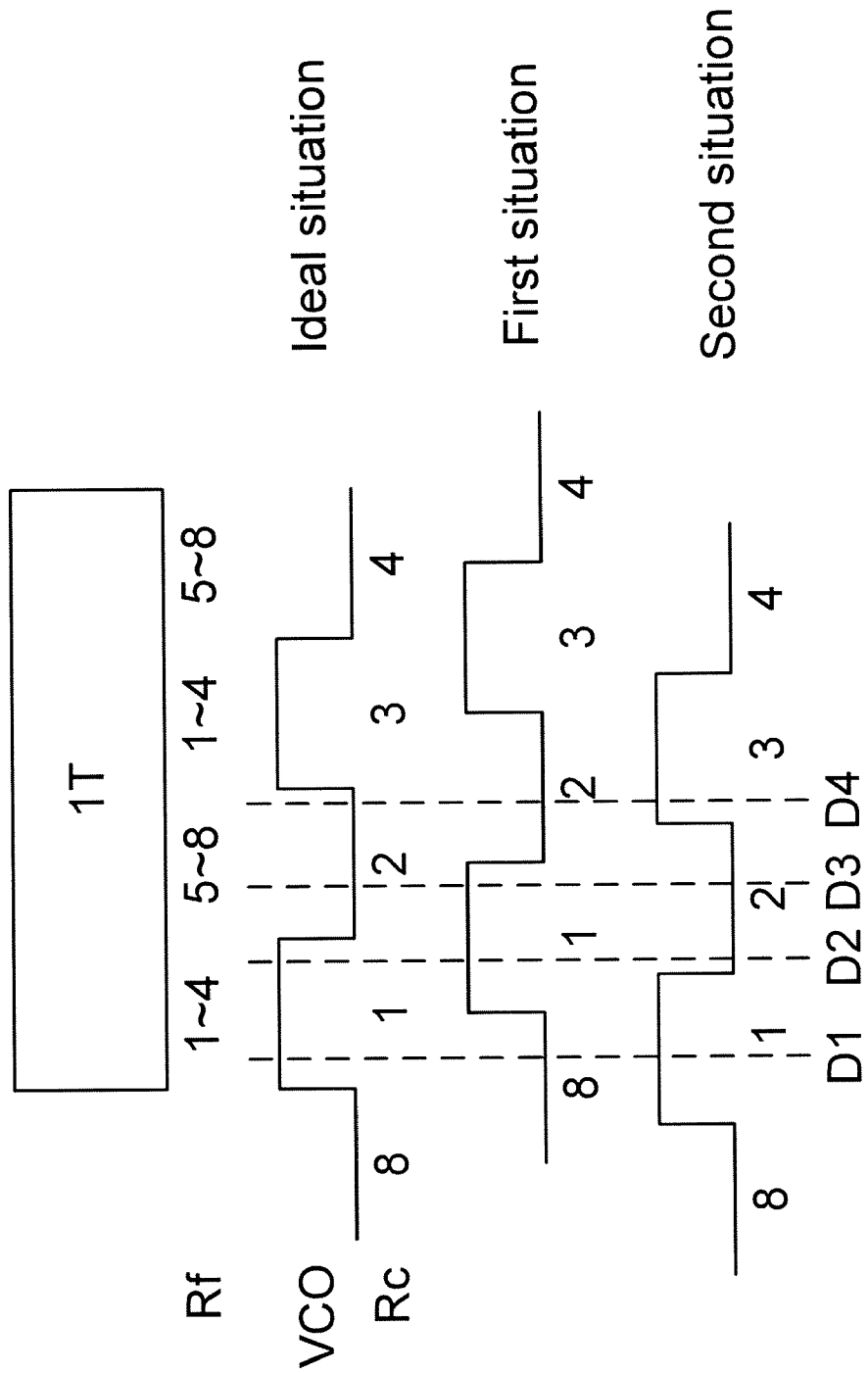
FIG. 7 illustrates a diagram for calibrating the phase according to one embodiment of the present invention.

FIG. 7 illustrates a diagram for calibrating the phase according to one embodiment of the present invention. In this embodiment, the phase calibration unit 660 can calibrate the coarse phase code Cc according to the fine phase code Cf. It is noted that the phase calibration unit 660 can also calibrate the fine phase code Cf according to the coarse phase code Cc. In FIG. 7, the top row shows an ideal situation where the starting point of the coarse time unit Tc and the starting point of the fine time unit Tf are aligned. The second row shows a first situation in which the starting point of the coarse time unit Tc is later or behind the starting point of the fine time unit Tf. The bottom row shows a second situation in which the starting point of the coarse time unit Tc is ahead of or earlier than the starting point of the fine time unit Tf. The above situation can be detected by the following method:

1. When the fine phase code is between 1 and 2, the coarse phase code should be odd. Supposing the coarse phase code is even, the starting point of the coarse time unit Tc is later than the starting point of the fine time unit Tf where the first dotted line D1 is shown in FIG. 7. Meanwhile, the coarse phase code is added by 1 for calibrating the phase code.

2. When the fine phase code is between 3 and 4, the coarse phase code should be odd. Supposing the coarse phase code is even, the starting point of the coarse time unit Tc is earlier than the starting point of the fine time unit Tf where the second dotted line D2 locates in FIG. 7. Meanwhile, the coarse phase code is subtracted by 1 for calibrating the phase code.

3. When the fine phase code is between 5 and 6, the coarse phase code should be even. Supposing the coarse phase code is odd, the starting point of the coarse time unit Tc is later than the starting point of the fine time unit Tf where the third dotted line D3 is shown in FIG. 7. Meanwhile, the coarse phase code is added by 1 for calibrating the phase code.

4. When the fine phase code is between 7 and 8, the coarse phase code should be even. Supposing the coarse phase code is odd, the starting point of the coarse time unit Tc is ahead of the starting point of the fine time unit Tf, as shown by the fourth dotted line D4 in FIG. 7. Meanwhile, the coarse phase code is subtracted by 1 for calibrating the phase code.

The above determining method is based on an error between the starting point of the coarse time unit Tc and the starting point of the fine time unit Tf that does not exceed 2 coarse time units Tc. When this assumption does not hold, other calibration methods for calibrating the coarse phase code Cc and the fine phase code Cf can also be applied.

Figure 8:
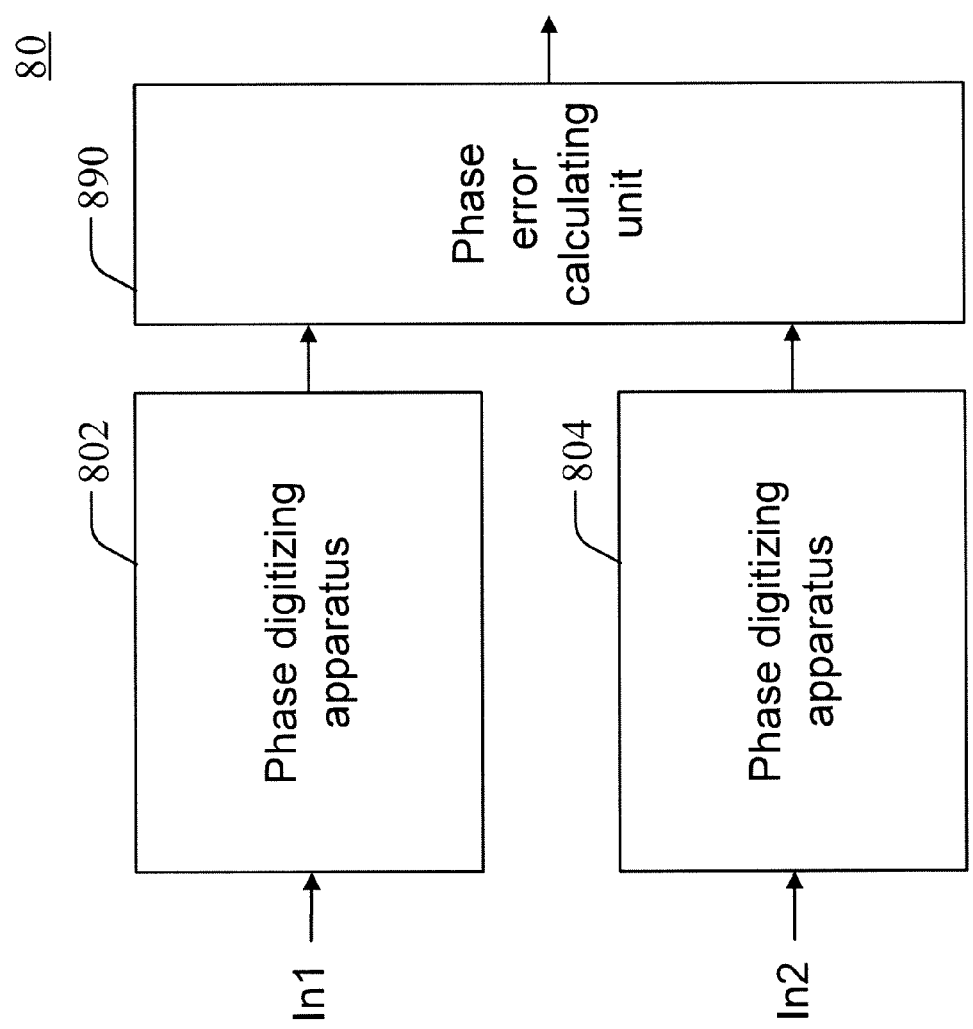
FIG. 8 is a block diagram of the phase error digitizing apparatus according to one embodiment of the present invention.

FIG. 8 is a block diagram of the phase error digitizing apparatus according to one embodiment of the present invention. The phase error digitizing apparatus 80 comprises phase digitizing apparatuses 802 and 804, and a phase error calculating unit 890. The phase digitizing apparatuses 802 and 804 can be realized by the previous phase digitizing apparatuses 20 or 60. The phase error digitizing apparatus 80 obtains phase digital values of input signals In1 and In2 by the phase digitizing apparatuses 802 and 804 respectively according to phases of the input signals In1 and In2, and then the phase error calculating unit 890 calculates the difference between the phase digital values of the input signals In1 and In2 to generate the phase error.

Figure 9:
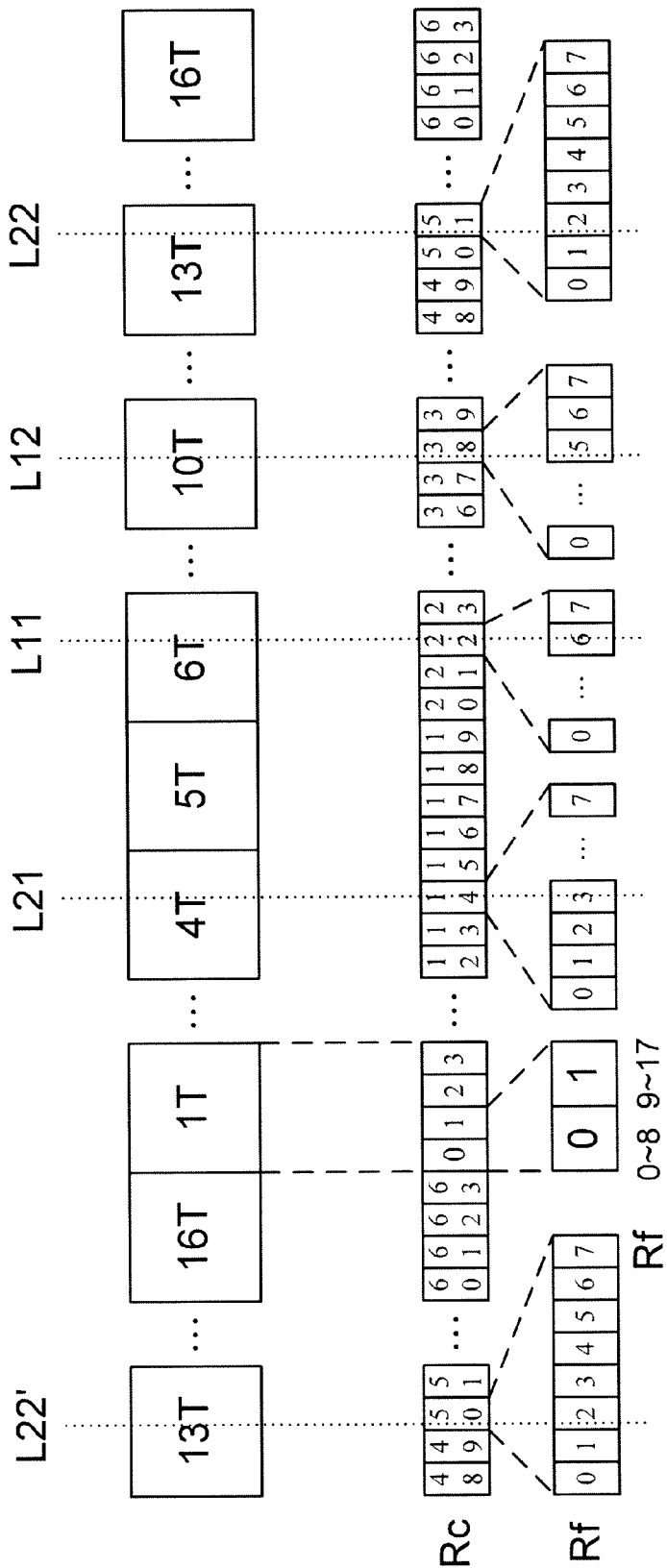
FIG. 9 illustrates a diagram for digitizing the phase error according to one embodiment of the invention.

FIG. 9 illustrates a diagram for digitizing the phase error according to one embodiment of the invention. Operation details of the phase digitizing apparatuses 802 and 804 are similar to those in the foregoing description, and in FIG. 9, differences are that one coarse time unit Tc comprises 9 fine time units Tf, the coarse ruler Rc is numbered from 0 to 63, and the fine ruler Rf is numbered from 0 to 17. In an embodiment, as a line L11 shown in FIG. 9, the phase digitizing apparatus 802 transforms the representation of the phase of the input signal In1 in the coarse time unit Tc and the fine time unit Tf into all in the fine time unit Tf to generate the phase digital value according to the coarse phase code Cc=22 and the fine phase code Cf=6 of the input signal In1 below:

$$22Tc*9Tf/Tc+6Tf=204Tf \text{ (fine time units)}$$

As a line L12 shown in FIG. 9, the phase digitizing apparatus 804 transforms the representation of the phase of the input signal In2 in the coarse time unit Tc and the fine time unit Tf into all in the fine time unit Tf to generate the phase digital value according to the coarse phase code Cc=38 and the fine phase code Cf=5 of the input signal In2 below:

$$38Tc*9Tf/Tc+5Tf=347Tf \text{ (fine time units)}$$

The phase error is 347−204=143 fine time units Tf.

In another embodiment, as a line L21 shown in FIG. 9, the phase digitizing apparatus 802 transforms the representation of the phase of the input signal In1 in the coarse time unit Tc and the fine time unit Tf into all in the fine time unit Tf to generate the phase digital value according to the coarse phase code Cc=14 and the fine phase code Cf=3 of the input signal In1 below:

$$14Tc*9Tf/Tc+3Tf=129Tf \text{ (fine time units)}$$

As a line L22 shown in FIG. 9, the phase digitizing apparatus 804 transforms the representation of the phase of the input signal In2 in the coarse time unit Tc and the fine time unit Tf into all in the fine time unit Tf to generate the phase digital value according to the coarse phase code Cc=51 and the fine phase code Cf=2 of the input signal In2 below:

$$51Tc*9Tf/Tc+2Tf=461Tf \text{ (fine time units)}$$

The phase error is 461−129=332 fine time units Tf. Since the coarse time unit Tc generated by the coarse ruler Rc is cyclic, when the phase error exceeds a half of the coarse ruler Rc, that is, taking FIG. 9 for example, a half of the coarse ruler Rc means that 32 Tc=32*9=288 Tf, the phase of the input signal In2 is actually earlier than the phase of the input signal In1, i.e., taking FIG. 9 for example, the fixed phase of the input signal In2 actually falls at a location as shown at a line L22', not the original calculated phase at the line L22. So in the embodiment, the fixed phase error is 288*2−332=244.

That is to say, since the coarse ruler Rc is cyclic, when there are more than two (including two) possibilities of the phase error, the situation with the smaller phase error can be selected. In the embodiment, when the phase of the input signal In2 is behind the phase of the input signal In1, the phase error is 332; however, when the phase of the input signal In2 is ahead of the phase of the input signal In1, the phase error is 244, and since 244 is smaller than 332, the situation with the smaller phase error 244 is selected. That is, the phase of the input signal In2 is ahead of the phase of the input signal In1, and the phase error is 244 fine time units Tf. It is noted that when the VCO is very inaccurate, the situation with the larger phase error can also be selected.

Figure 10:
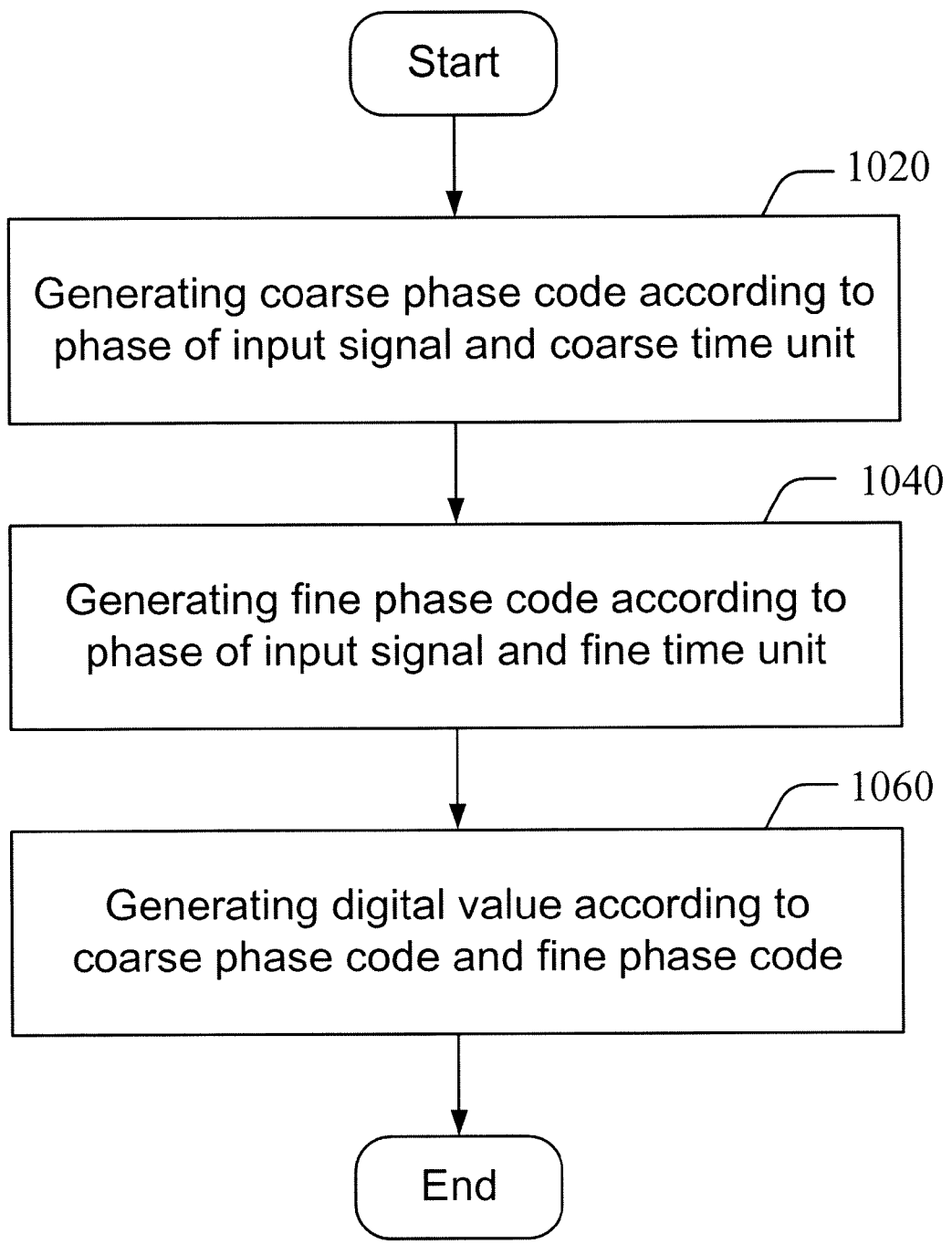
FIG. 10 is a flowchart of a phase digitizing method according to one embodiment of the invention.

FIG. 10 is a flowchart of a phase digitizing method according to one embodiment of the invention. Step 1020 comprises generating a coarse phase code according to a phase of an input signal and a coarse time unit Tc. The coarse time unit Tc generates a coarse ruler Rc numbered by the Gray code sequentially within a predetermined time, i.e., values of the Gray code with a time shift of a multiple of the predetermined time are the same. Taking FIG. 4 for example, the coarse ruler Rc starts from 000, and 001, 011, 010, 110, 111, 101 and 100 in turn, after 4T time, the coarse ruler Rc is cyclically back to 000, and the corresponding binary codes are 000 (0), 001 (1), 010 (2), 011 (3), 100 (4), 101 (5), 110 (6) and 111 (7), respectively. In the embodiment shown in FIG. 4, the phase is detected as shown at a line L. According to the coarse ruler Rc and the phase of the input signal In, the Gray code is 110, i.e., 4, and then the Gray code 110 is converted to the binary code 100, i.e., the coarse phase code Cc is 100.

Step 1040 comprises generating a fine phase code according to the phase of the input signal and a fine time unit Tf. In the embodiment in FIG. 4, the phase is detected as shown at the line L. Based on the levels of the clock signals FCLK[1]~[8], the corresponding value is generated sequentially as [1 1 0 0 0 0 1 1]. Then, the boundary that 1 changes to 0 is determined at 2 of the fine ruler Rf. That is to say, the fine phase code Cf is 2, which can also be represented as the binary code 010.

Finally, Step 1060 comprises generating the digital value according to the coarse phase code and the fine phase code. For example, as the line L0 in FIG. 5, the coarse phase code Cc=7, the fine phase code Cf=2, and then the digital value is generated below:

$$7Tc*8Tf/Tc+2Tf=58Tf \text{ (fine time units)}$$

The phase digitizing apparatus of the invention can be applied on any systems or circuits needing phase error calculation, such as a phase-locked loop (PLL) or a frequency synthesizer. When an apparatus, such as the PLL, calculates the phase error according to the invention, considering the system stability and preventing the misjudgment from a burst error, it is preferred not to adjust the phase much at once. Accordingly, an upper bound of the phase error can be set. When the phase error is greater than the upper bound, the phase error is set to be the upper bound. In a preferable embodiment, the upper bound can be set to 35 fine time units Tf, i.e., not beyond 1T. In the above two embodiments, the phase errors are both greater than the upper bound 35, so the final outputting phase errors can be set to 35. Those skilled in the art appreciate that the original phase error can also be outputted, and the latter apparatus can be used to determine whether the phase error exceeds the upper bound.

While the invention has been described in terms of what is presently considered to be the most practical and preferred embodiments, it is to be understood that the invention needs not to be limited to the above embodiments. On the contrary, it is intended to cover various modifications and similar arrangements included within the spirit and scope of the appended claims which are to be accorded with the broadest interpretation so as to encompass all such modifications and similar structures.

What is claimed is:

1. A phase digitizing apparatus for generating a digital value in response to a phase of an input signal comprising:
    a coarse phase code generator, for generating a coarse phase code according to the phase of the input signal and a first time unit;
    a fine phase code generator, for generating a fine phase code according to the phase of the input signal and a second time unit; and
    a calculating unit, for generating the digital value according to the coarse phase code and the fine phase code;
    wherein the first time unit is greater than the second time unit, and the first time unit is generated according to a first clock, and the second time unit is generated according to a plurality of phases of a second clock.

2. The apparatus according to claim 1, wherein the first time unit comprises N number of second time units, wherein N is a positive integer.

3. The apparatus according to claim 2, wherein the calculating unit performs calculation on the coarse phase code and the fine phase code to generate the digital value according to a relation of the first time unit and the second time unit.

4. The apparatus according to claim 3, wherein the calculating unit multiplies the coarse phase code by N and then adds the fine phase code to generate the digital value.

5. The apparatus according to claim 1, wherein a frequency of the first clock is lower than a frequency of the second clock.

6. The apparatus according to claim 1, further comprising a phase calibrating unit, for determining a phase relation between the first clock and the second clock to calibrate the coarse phase code and the fine phase code.

7. The apparatus according to claim 1, wherein the coarse phase code generator comprises:
    a Gray code generator, for generating a Gray code according to the phase of the input signal; and
    a phase code converter, for converting the Gray code to a binary code to generate the coarse phase code.

8. The apparatus according to claim 1, wherein the first time unit is used for generating a ruler, used to generate the coarse phase code, and the ruler is cyclic.

9. A phase digitizing method for generating a digital value in response to a phase of an input signal comprises:
    generating a coarse phase code according to the phase of the input signal and a first time unit;
    generating a fine phase code according to the phase of the input signal and a second time unit; and
    generating the digital value according to the coarse phase code and the fine phase code;
    wherein the first time unit is greater than the second time unit, and the fist time unit is generated according to first clock, and the second time unit is generated according to a plurality of phases of a second clock.

10. The method according to claim 9, wherein the first time unit comprises N second time units, wherein N is a positive integer.

11. The method according to claim 10, wherein the step of generating the digital value according to the coarse phase code and the fine phase code comprises performing calculation on the coarse phase code and the fine phase code to generate the digital value according to a relationship between the first time unit and the second time unit.

12. The method according to claim 11, wherein the step of generating the digital value according to the coarse phase code and the fine phase code comprises multiplying the coarse phase code by N and then adding the fine phase code to generate the digital value.

13. The method according to claim 12, further comprising determining a phase relation of the first clock and the second clock to calibrate the coarse phase code and the fine phase code.

14. The method according to claim 9, wherein a frequency of the first clock is lower than a frequency of the second clock.

15. The method according to claim 9, wherein the step of generating the coarse phase code according to the phase of the input signal and the first time unit, comprises:

generating a Gray code according to the phase of the input signal; and converting the Gray code to a binary code to generate the coarse phase code.

16. The method according to claim 9, wherein the first time unit is used for generating a ruler used to generate the coarse phase code, and the ruler is cyclic.

17. A phase digitizing apparatus, for calculating a phase according to a first phase of a first input signal and a second phase of a second input signal, comprising:

a first coarse phase code generator, for generating a first coarse phase code according to the first phase of the first input signal and a coarse time unit;

a first fine phase code generator, for generating a first fine phase code according to the first phase of the first input signal and a fine time unit;

a first calculating unit, for calculating a first digital value according to the first coarse phase code and the first fine phase code;

a second coarse phase code generator, for generating a second coarse phase code according to the second phase of the second input signal and the coarse time unit;

a second fine phase code generator, for generating a second fine phase code according to the second phase of the second input signal and the fine time unit;

a second calculating unit, for calculating a second digital value according to the second coarse phase code and the second fine phase code; and a phase calculating unit, for calculating the phase according to the first digital value and the second digital value.

18. The apparatus according to claim 17, wherein when a plurality of possible values exists, the smallest value of the possible values is selected as the phase.

* * * * *